United States Patent
Gousev et al.

(10) Patent No.: US 7,078,300 B2
(45) Date of Patent: Jul. 18, 2006

(54) THIN GERMANIUM OXYNITRIDE GATE DIELECTRIC FOR GERMANIUM-BASED DEVICES

(75) Inventors: Evgeni Gousev, Mohopac, NY (US); Huiling Shang, Yorktown Heights, NY (US); Christopher P. D'Emic, Ossining, NY (US); Paul M. Kozlowski, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 10/672,631

(22) Filed: Sep. 27, 2003

(65) Prior Publication Data

US 2005/0070122 A1    Mar. 31, 2005

(51) Int. Cl.
*H01L 21/336* (2006.01)

(52) U.S. Cl. ............ 438/285; 438/287; 438/518; 438/520; 438/522; 438/590; 438/591; 438/767; 438/779; 438/906; 438/933

(58) Field of Classification Search ............ 438/285, 438/287, 518, 520, 522, 590–591, 767, 779, 438/906, 933
See application file for complete search history.

(56) References Cited

U.S. PATENT DOCUMENTS

| | | | | |
|---|---|---|---|---|
| 3,843,398 A * | 10/1974 | Maagdenberg | ............... | 438/763 |
| 4,870,322 A | 9/1989 | Matsudaira et al. | ......... | 313/506 |
| 5,241,214 A | 8/1993 | Herbots et al. | ............. | 257/649 |
| 5,571,734 A | 11/1996 | Tseng et al. | ................ | 438/591 |
| 6,596,597 B1 | 7/2003 | Furukawa et al. | .......... | 438/299 |
| 6,703,277 B1 * | 3/2004 | Paton et al. | ................. | 438/287 |
| 6,706,581 B1 * | 3/2004 | Hou et al. | .................. | 438/216 |
| 6,800,519 B1 * | 10/2004 | Muraoka et al. | ............ | 438/216 |
| 2002/0052124 A1 * | 5/2002 | Raaijmakers et al. | ....... | 438/778 |
| 2002/0151142 A1 * | 10/2002 | Callegari et al. | ........... | 438/287 |
| 2002/0197886 A1 | 12/2002 | Niimi | ......................... | 438/783 |
| 2003/0073290 A1 * | 4/2003 | Ramkumar et al. | ......... | 438/287 |
| 2003/0207555 A1 * | 11/2003 | Takayanagi et al. | ........ | 438/590 |
| 2004/0005740 A1 * | 1/2004 | Lochtefeld et al. | ......... | 438/149 |
| 2005/0070053 A1 * | 3/2005 | Sadaka et al. | .............. | 438/151 |
| 2005/0199954 A1 * | 9/2005 | Lochtefeld et al. | ......... | 257/347 |
| 2005/0205934 A1 * | 9/2005 | Lochtefeld et al. | ......... | 257/347 |
| 2006/0051925 A1 * | 3/2006 | Ahn et al. | .................. | 438/287 |

OTHER PUBLICATIONS

Berla L K et al: "High Quality Gate Dielectrics Grown by Rapid Thermal Processing Using Split-N20 Technique on Strained SI(0.91)GE(0.09) Films" IEEE Electron Device Letters, vol. 22, No. 8, pp. 387-389, Aug. 2001.

(Continued)

*Primary Examiner*—Lynne A. Gurley
(74) *Attorney, Agent, or Firm*—George Sai-Halasz; Robert M. Trepp

(57) ABSTRACT

A method for producing thin, below 6 nm of equivalent oxide thickness, germanium oxynitride layer on Ge-based materials for use as gate dielectric is disclosed. The method involves a two step process. First, nitrogen is incorporated in a surface layer of the Ge-based material. Second, the nitrogen incorporation is followed by an oxidation step. The method yields excellent thickness control of high quality gate dielectrics for Ge-based field effect devices, such as MOS transistors. Structures of devices having the thin germanium oxynitride gate dielectric and processors made with such devices are disclosed, as well.

16 Claims, 5 Drawing Sheets

OTHER PUBLICATIONS

Maikap S et al: "NO/O2/NO Plasma-Grown Oxynitride Films on Strained-SI(1-X)GE(X)" Electronics Letters, vol. 35, No. 14, pp. 1202-1203, Jul. 1999.

Gregory O. J. at al.: "Electrical Characterization of Some Native Insulators on Germanium" Materials Research Society Symposium, Proceedings vol. 76, pp. 307-311, 1987.

* cited by examiner

THIN GERMANIUM OXYNITRIDE GATE DIELECTRIC FOR GERMANIUM-BASED DEVICES

FIELD OF THE INVENTION

The present invention relates to electronic devices and systems. In particular it relates to a method of producing a germanium oxynitride layer for use as a thin gate dielectric.

BACKGROUND OF THE INVENTION

Today's integrated circuits include a vast number of devices. Smaller devices are key to enhance performance and to improve reliability. As MOS (Metal Oxide Semiconductor Field-Effect-Transistor, a name with historic connotations meaning in general an insulated gate Field-Effect-Transistor) devices are being scaled down, the technology becomes more complex and new methods are needed to maintain the expected performance enhancement from one generation of devices to the next.

SUMMARY OF THE INVENTION

Gate dielectrics is one of the main problems for MOS field effect device scaling. This is true for both conventional silicon devices and more advanced (e.g. SiGe, Ge) devices.

In Ge-based devices, the situation is quite complicated. The term "Ge-based" typically refers to SiGe compounds, where the Ge concentration is over about 30–40%. The term Ge-based also includes an essentially pure Ge material. So far no reliable high-quality gate dielectric has been found for Ge based materials. Germanium oxide is of poor quality and is soluble in water. Binary metal oxides (e.g. $ZrO_2$, $HfO_2$) show ~40% electron mobility degradation when used as gate dielectrics. Germanium oxynitride quality and scaling potential up to now was thought to be inferior to the $SiO_2/Si$ system.

Ge-based devices are a higher-performance alternative to conventional Si-based devices due to their better carrier mobility, especially for holes. Of all gate insulators on Ge substrates explored and reported so far, germanium oxynitride shows best potential performance. However, the rate of thermal oxidation/oxynitridation of Ge is much faster than that of Si. This makes it difficult to grow thin germanium oxynitride films with good process control, and/or with an equivalent oxide thickness (EOT) of below about 6 nm. (Since the quintessential gate dielectric material is $SO_2$, this material stands a the standard for comparison. Since the dielectric constant of germanium oxynitride [about 6 to 9] differs form that of $SiO_2$, the meaningful value as far as thickness is concerned is an equivalent thickness in $SiO_2$. This equivalence refers to capacitance, meaning the thickness of such an $SiO_2$ layer which has the same capacitance per unit area as the germanium oxynitride layer.)

The present invention offers a solution for the problem of growing a thin germanium oxynitride layer in a controlled manner. The solution involves using a two step process. The first step being incorporating a first concentration of nitrogen into a surface layer underneath a first surface of the Ge-based material. This nitrogen-rich region acts as a diffusion/reaction barrier that controls the germanium oxidation/oxynitridation rate in a second, oxidation step. Such a control allows one to grow ultrathin germanium oxynitrides in a governable, reproducible manner. The thin germanium oxynitride gate dielectric allows for improved properties and higher performance in Ge-based field effect devices.

The method of the present invention offers two independent controls of the dielectric formation. Firstly, the initial step defines nitrogen incorporation into the surface/subsurface region of Ge-base material substrate, and hence its diffusion barrier "power", and dielectric constant. Secondly, the subsequent oxidation step controls final thickness of the germanium oxynitride film.

Accordingly it an objective of the present invention to teach a method of producing a thin, below 6 nm, preferably below 5 nm of EOT, good quality germanium oxynitride insulator layers on Ge-based materials.

It is also an object of the invention to teach a method for fabricating Ge-based field effect devices which contain the good quality germanium oxynitride insulator layers as gate dielectrics.

It is a further object of the present invention to teach processors which comprise chips containing such a Ge-based field effect device having preferably below 6 nm of EOT, good quality germanium oxynitride gate insulator layers on Ge-based materials.

BRIEF DESCRIPTION OF THE DRAWINGS

These and other features of the present invention will become apparent from the accompanying detailed description and drawings, wherein.

DETAILED DESCRIPTION OF THE INVENTION

In the fabrication of high performance Ge-based field effect devices the processing steps that preceded the production of the gate dielectric are known in the art. These steps, such as device isolation, dopant well formation, etc., are assumed to have been completed before commencing the steps of the present invention. However, before the disclosed method steps can take place to produce an the thin germanium oxynitride layer, a surface, referred to as a first surface, of the Ge based material, generally a wafer, the one which will be the recipient of the gate dielectric, has to be properly cleaned. In a representative embodiment such cleaning steps can include, but are not limited to, at least one cycle of oxidation and germanium oxide removal. The oxidation is preferably performed in $H_2O_2$ solutions, while oxide removal is accomplished by HF, or HCl, or their mixtures. After the cleaning step the first surface of the Ge based material, which is host to the devices, is ready for a step by which a first concentration of nitrogen will become incorporated into a surface layer underneath the first surface.

Figure 1A:
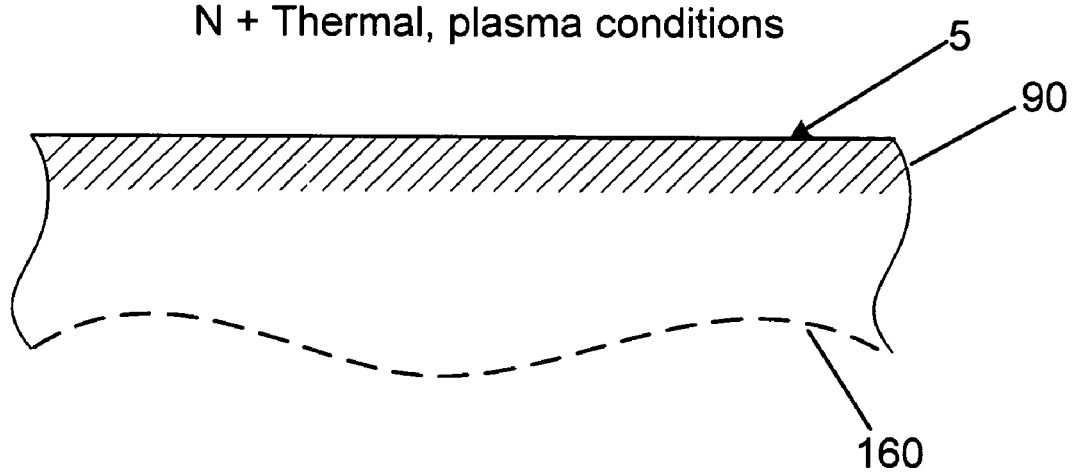
FIG. 1A–1B shows nitrogen incorporation steps of the method in representative embodiments.

FIG. 1 shows a nitrogen incorporation steps of the method in representative embodiments. FIG. 1A shows an embodiment wherein the nitrogen incorporation is carried out by subjecting the first surface 5 of the Ge-based body 160, typically the surface of a Ge-based material wafer, to a nitrogen containing gas under thermal, or plasma conditions. The reactive nitrogen containing gas in a representative embodiment is $NH_3$. In alternate embodiments this nitrogen containing reagent may also be NO or $N_2O$. In further alternate embodiments one can use various combinations of the gases $NH_3$, NO, or $N_2O$. All of these species can be sources of atomic nitrogen under the proper circumstances. In each case these active components can be mixed in with inert components, or carrier gases, such as $N_2$, Ar, He, etc.

The thermal conditions for this chemical nitrogen incorporation step can be between 450° C. and 700° C. applied for between 1 second and 300 seconds. The temperature typically is applied by rapid thermal annealing techniques, well known in the art. Conditions for this step in a representative embodiment can be: $NH_3$ active gas at 600° C. for 30 seconds. Depending on the conditions, the resulting nitridated thin layer 90 characteristically is between about 0.5 nm and 1.5 nm thick. This layer 90 incorporates a first concentration of nitrogen, which first concentration has an integrated value giving a surface density of incorporated nitrogen between about 1E14 per $cm^2$ and 3E15 per $cm^2$.

The nitrogen incorporation step can also be performed by the use of plasma nitridation. In this case, a first surface of the Ge-based surface is exposed to a low energy nitrogen containing plasma. It can be done in a direct plasma mode or by remote (downstream) plasma nitridation. Plasma power can be varied in the about 25 W–1000 W range, exposure preferably is between 1 sec and 300 sec. The sample temperature during plasma exposure is preferred to be from about room temperature to 500° C. $N_2$, $NH_3$ and $N_2O$ gates can be used in plasma reactors as N source.

Figure 1B:
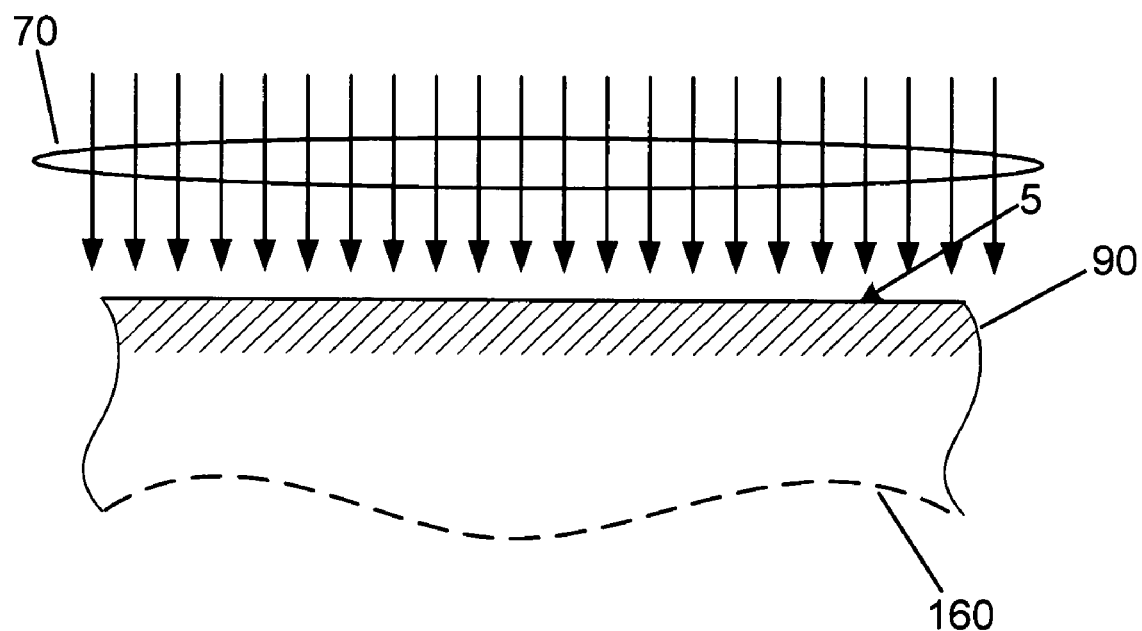

FIG. 1B schematically shows the step of nitrogen incorporation when this step is carried out by ion implanting 70 a nitrogen dose into the first surface 5 on the Ge-based material body 160. The implantation energy should be low, typically between 0.5 KeV and 10 keV. In this manner the N ends up located close to the first surface 5 in a layer 90. Alternatively, instead of using such low implant energy, but to assure that the N will be in the thin layer 90, the ion implantation can be performed through a thin, 10 nm to 30 nm, screen layer. Such screening techniques are known in the art. The screen layer in an exemplary embodiment being, for instance, deposited $SiO_2$, which after the implantation can be chemically removed. The implant dose of N can typically be between about 1E15 per $cm^2$ and 2E16 per $cm^2$.

Figure 2:
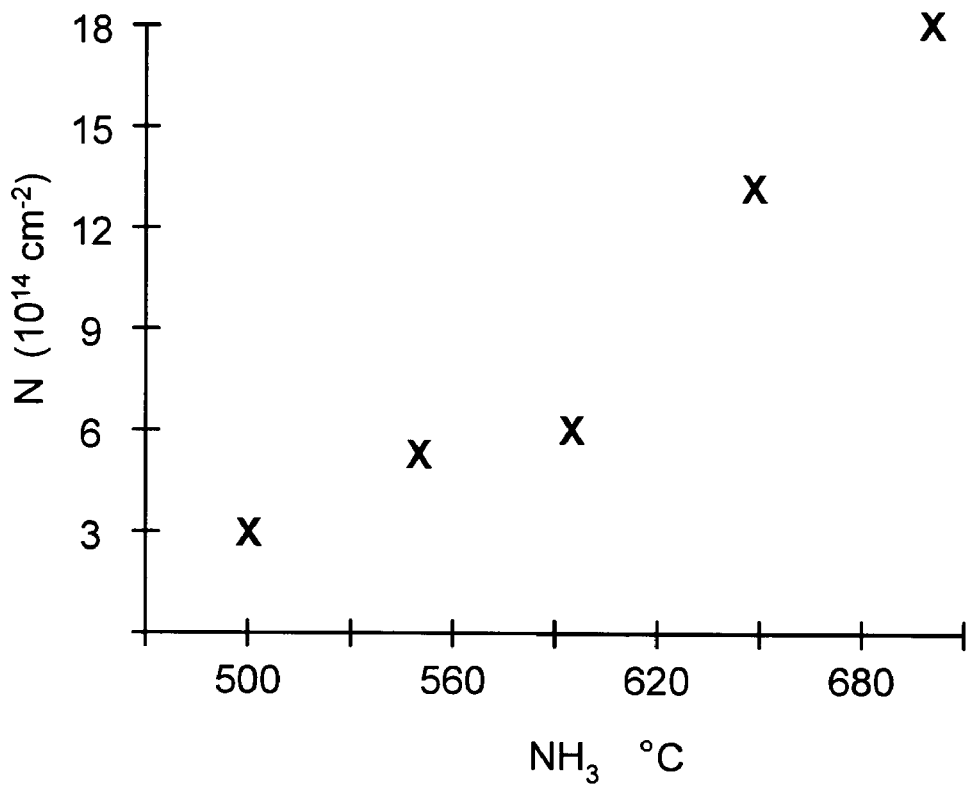
FIG. 2 shows a plot of nitrogen incorporation vs. thermal conditions in the execution of the nitrogen incorporation step.

FIG. 2 shows a plot of characteristic nitrogen incorporation vs. thermal conditions in the execution of the N incorporation step, as the concentration is being measured by nuclear reaction analysis. On the vertical axis the integrated concentration in the layer 90 is shown against the temperature of reaction when $NH_3$ was the reagent gas, during a 30 sec exposure.

Independently, whether the nitrogen incorporation step is carried out by subjecting the first surface 5 to a nitrogen containing gas under thermal conditions or plasma conditions, or by N ion implantation, the amount of nitrogen, introduced in the nitrogen incorporation step governs the oxidation rate during the next, the oxidation step. With the trend of more nitrogen providing more slow reoxidation kinetics, and therefore thinner films.

Figure 3:
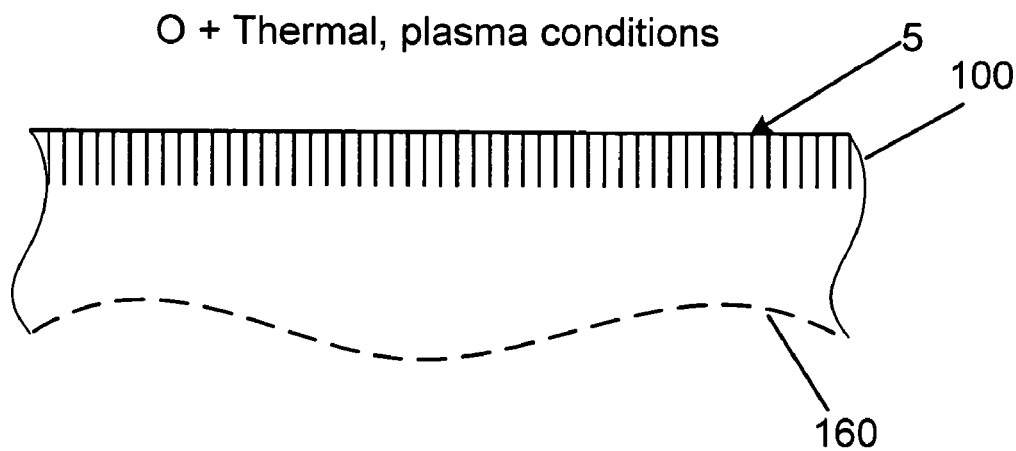
FIG. 3 shows the oxidation step completing the production of a thin germanium oxynitride layer.

FIG. 3 shows the oxidation step which completes the production of the thin a germanium oxynitride layer. This is a second step in the invention, when the nitrogen containing layer controls the oxidation rate of the Ge-based material 160 as the first surface 5 is exposed to an oxygen ambient under thermal, or plasma conditions. The thin surface layer incorporating nitrogen 90 is regulating production of the oxynitride layer 100, while layer 90 itself is also transformed into the oxynitride layer 100.

The oxygen ambient in a representative embodiment contains as reactive species $O_2$, $O_3$, $H_2O$, NO, $N_2O$ since they can be sources of atomic oxygen. Combinations of these gases can also be used. Typically the reactive gases can be mixed in with inert components, such as N2, Ar, He, etc. That the oxidation step can also be performed in nitrogen containing gases, such as, $N_2O$, NO is due to the fact that they tend to decompose at high-temperatures releasing atomic oxygen. Similarly, oxidation can be carried out by wet oxidation using H2O vapor mixed in a carrier inert gas. The thermal ambient in this step is typically a temperature between 500° C. and 700° C., applied for between 1 minute and 30 minutes. After finishing with the oxygen exposure step the germanium oxynitride layer is ready as the gate dielectric, and one can proceed with further processing of devices in a standard manner.

The oxidation step can also be performed by the use of plasma oxidation. In this case, the first surface 5 with the nitrogen containing layer 90 underneath is exposed to a low energy oxygen containing plasma. This can be done in a direct plasma mode or by remote (downstream) plasma oxidation. Plasma power can be varied in the about 25 W–1000 W range, exposure preferably is between 1 sec and 300 sec. The sample temperature during plasma exposure is preferred to be from about room temperature to 500° C. The same oxygen containing species can be used as with the thermal oxidation.

Figure 4:
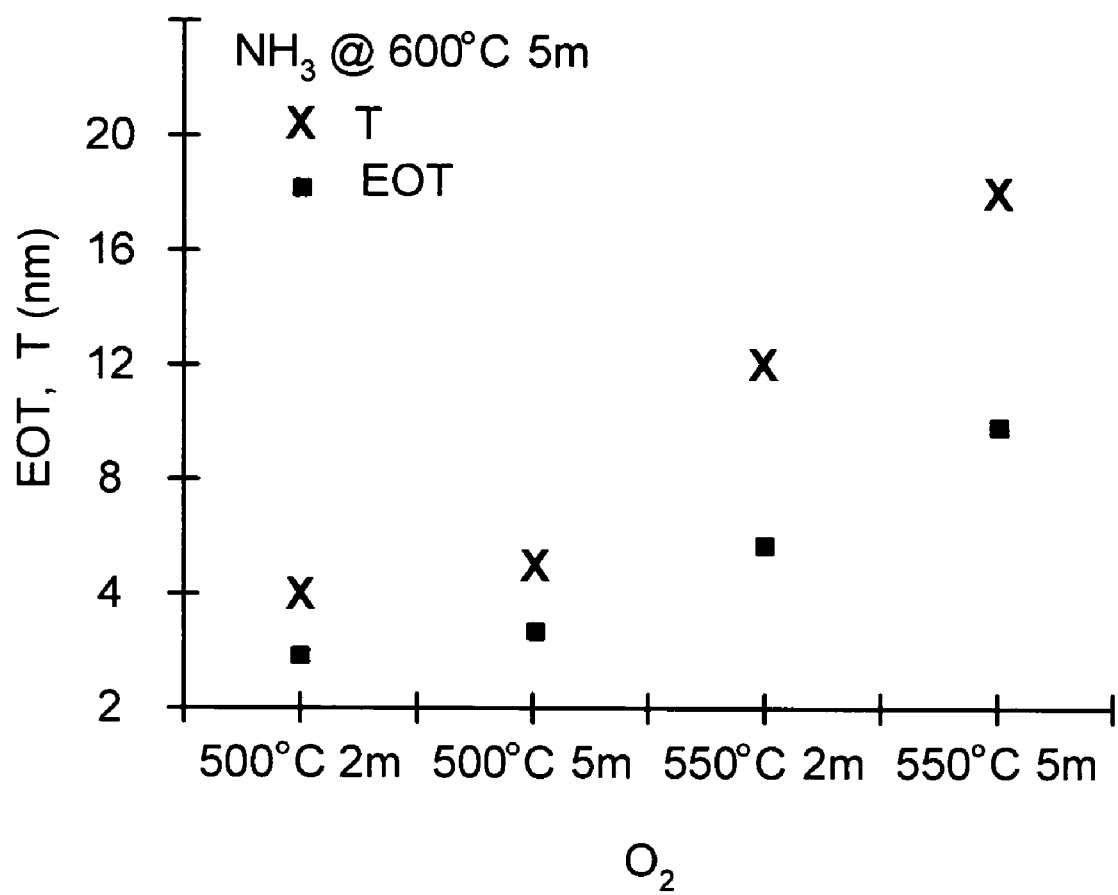
FIG. 4 shows plots of the thickness and EOT of the thin germanium oxynitride layer vs the conditions of the oxygen ambient exposure step.

FIG. 4 shows plots of the thickness and of the EOT of the thin germanium oxynitride layer 100 vs the conditions of the oxygen ambient exposing step, when the nitrogen incorporation step involved $NH_3$ exposure at 600° C. for 5 minutes. Since the quintessential gate dielectric material is $SiO_2$ this material stands a the standard comparison. Since the dielectric constant of germanium oxynitride differs form that of $SiO_2$, it is useful to not only give the thickness of the thin germanium oxynitride layer 100, but also give equivalent thickness in $SiO_2$. The equivalence means the thickness of such an $SiO_2$ layer which has the same capacitance per unit area. Thus in FIG. 4 the EOT values are the results of standard capacitance versus voltage measurements. FIG. 4 shows how sensitively the thickness of the germanium oxynitride can be controlled, and that the EOT of the germanium oxynitride layer is tuned even in the unprecedented, below 5 nm range, by controlling the thermal budget during the oxygen exposure step.

This invention can thus produce germanium oxynitride layers that have less than about 10 nm of EOT. A preferred range of germanium oxynitride gate dielectric for high performance devices is below 6 nm of EOT, preferably having a range between 0.5 nm and 5 nm of EOT.

When the Ge-based material is actually essentially pure Ge, the invention is particularly significant, since pure Ge devices can potentially deliver the best performance.

It is emphasized that the present method offers an additional process flexibility, namely to grow multiple, for example dual, oxynitride dielectric thicknesses for different devices/applications on the same wafer by incorporating different amounts of nitrogen in differing parts of the wafer. The first surface 5, would have at least two differing locations, where the nitrogen incorporation step is carried out in manners to yield differing first concentrations of the incorporated nitrogen. Accordingly, the produced, final oxynitride layers on the at least two locations end up having differing EOT.

Figure 5:
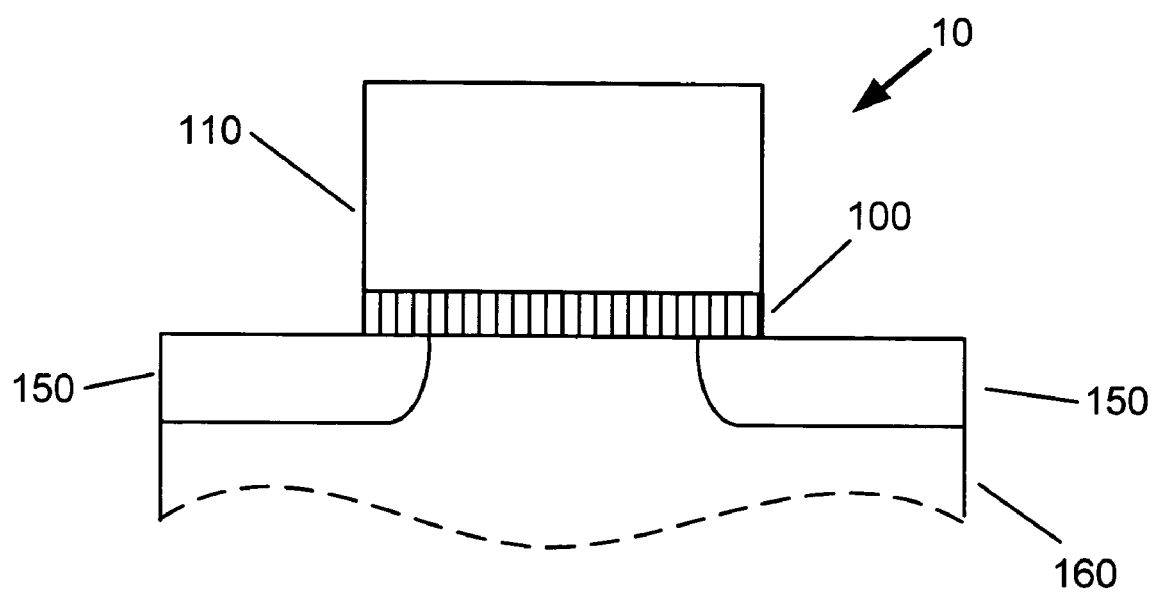
FIG. 5 shows a schematic cross sectional view of a Ge-based field effect device having a thin germanium oxynitride gate dielectric.

FIG. 5 shows a schematic cross sectional view of a Ge-based field effect device 10 having a thin germanium oxynitride layer 100 gate dielectric, preferably having an equivalent oxide thickness of less than 5 nm. The gate dielectric germanium oxynitride 100 is an insulator, separating a conductive gate 110 from a Ge-based body 160.

Germanium oxynitride, in general, has a high dielectric constant, which means over approximately 4, which can result in germanium oxynitride having a high barrier, namely exhibiting high resistance, against charge tunneling. As the thickness of gate dielectrics is decreasing in order to increase the gate-to-channel capacitance, resistance against charge tunneling across the gate dielectric is an important issue. The standard gate dielectric material $SiO_2$ (dielectric constant of 3.9), does have such problems. Since the dielectric constant of germanium oxynitride is larger than that of $SiO_2$, a germanium oxynitride layer which has the same capacitance per unit area as a $SiO_2$ layer is thicker than the $SiO_2$ layer. Since resistance against tunneling depends exponentially on layer thickness, the germanium oxynitride layer will tend to be the more charge penetration resistant.

FIG. 5 depicting a Ge-based, or in a representative embodiment pure Ge, field effect device is almost symbolic, in that it is meant to represent any kind of field effect device. The only common denominator of such devices is that the device current is controlled by a gate 110 acting by its field across an insulator, the so called gate dielectric 100. Accordingly, every field effect device has a (at least one) gate, and a gate insulator.

FIG. 5 depicts schematically an MOS field effect device, with the source/drain regions 150, device body 160. The body, can be bulk, as shown on FIG. 5, or it can be a thin film on an insulator. The channel can be a single one, or multiple one, as on double gated, or FINFET devices. The basic material of the device can be of a wide variety. The body can be a Ge compound, or consisting of essentially pure Ge.

In a representative embodiment the Ge-based field effect device is a Ge MOS. In a further representative embodiment the Ge-based field effect device has a germanium oxynitride layer gate dielectric which preferably has an EOT range between 0.5 nm and 5 nm.

Figure 6:
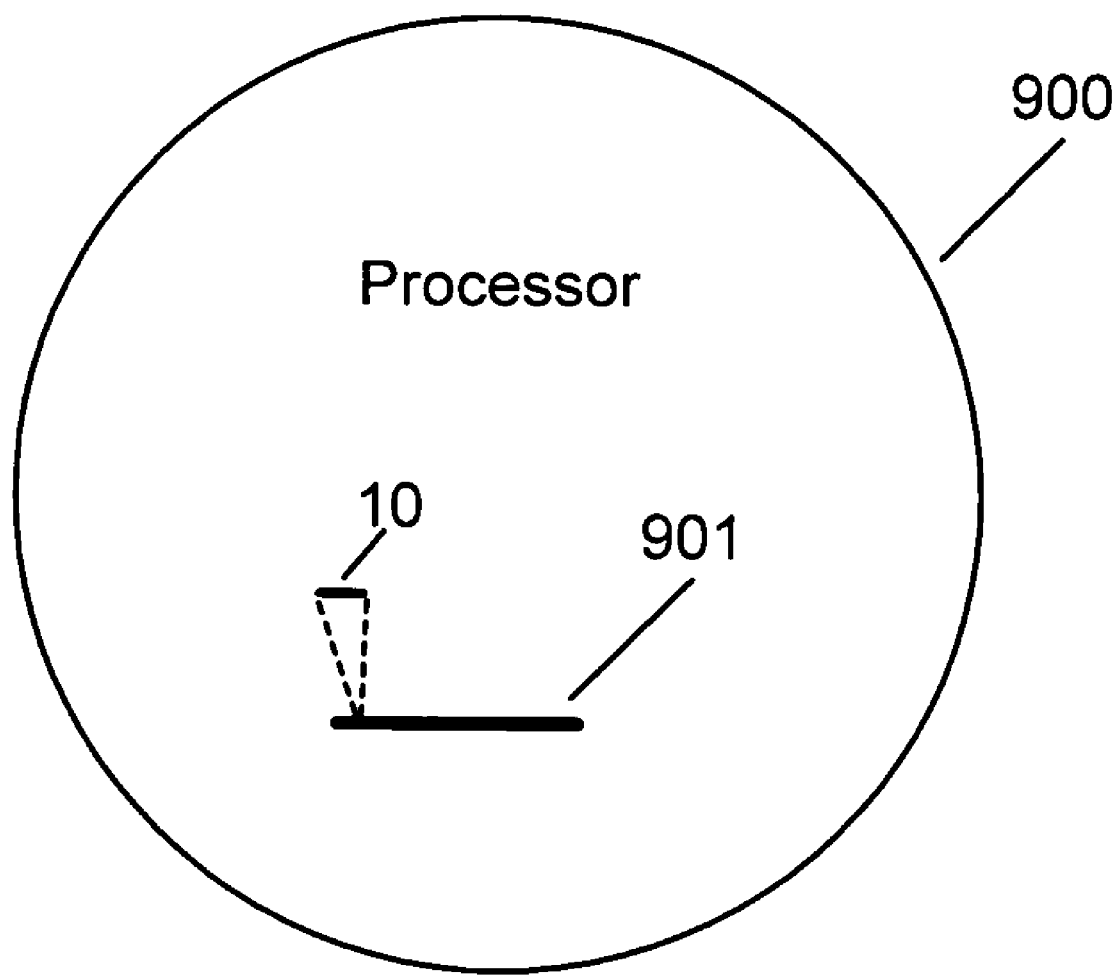
FIG. 6 shows a symbolic view of a high performance processor containing at least one chip which contains a Ge-based field effect device having a thin germanium oxynitride gate dielectric.

FIG. 6 shows a symbolic view of a high performance processor 900 containing at least one chip 901 which contains a Ge-based field effect device 10 having a thin germanium oxynitride gate dielectric, which has an EOT of less than 5 nm. The processor 900 can be any processor which can benefit from the germanium oxynitride gate dielectric Ge-based field effect device. These devices can form part of the processor in their multitude on one or more chips 901. Representative embodiments of processors manufactured with the thin germanium oxynitride gate dielectric Ge-based field effect devices are digital processors, typically found in the central processing complex of computers; mixed digital/analog processors, which benefit significantly from the high mobility of the carriers in the germanium oxynitride gate dielectric field effect devices; and in general any communication processor, such as modules connecting memories to processors, routers, radar systems, high performance video-telephony, game modules, and others.

Many modifications and variations of the present invention are possible in light of the above teachings, and could be apparent for those skilled in the art. The scope of the invention is defined by the appended claims.

We claim:

1. A method for producing an oxynitride layer, the method comprising:
   providing a wafer of Ge-based material, the Ge-based material having a first surface; and
   carrying out a two step process consisting of a first step followed by a second step, wherein the first step consists of incorporating underneath the first surface a first concentration of nitrogen having a surface density of between about 1E14 per $cm^2$ and 3E15 per $cm^2$, and wherein the second step consists of exposing the first surface to an oxygen containing ambient, thereby oxidizing the Ge-based material and growing the oxynitride layer, wherein the first concentration is so chosen as to govern the oxidizing rate during the second step, wherein the produced oxynitride layer is controlled to be between 0.5 nm and 5 nm of equivalent oxide thickness (EOT).

2. The method of claim 1, wherein the Ge-based material consists essentially of Ge.

3. The method of claim 1, wherein the first step is carried out by subjecting the first surface to a nitrogen containing gas under thermal conditions.

4. The method of claim 3, wherein the nitrogen containing gas is $NH_3$, and the thermal conditions are selected to be between 450° C. and 700° C. applied for between 1 second and 300 seconds.

5. The method of claim 1, wherein the first step is carried out by ion implanting a nitrogen dose into the first surface.

6. The method of claim 2, wherein the nitrogen dose is selected to be between about 1E15 per $cm^2$ and 2E16 per $cm^2$ with an implantation energy of between about 0.5 KeV and 10 keV.

7. The method of claim 6, wherein the ion implanting is carried out through a screen layer.

8. The method of claim 1, wherein the first step is carried out by subjecting the first surface to a nitrogen containing plasma applied with a power of between about 25 W and 1000 W, at a temperature of between about room temperature and 500° C., and for a time of between about 1 sec and 300 sec.

9. The method of claim 1, wherein the second step is carried out by subjecting the first surface under thermal conditions to species selected from the group consisting of $O_2$, $O_3$, $H_2O$, NO, $N_2O$, and combinations of these species thereof.

10. The method of claim 9, wherein the thermal conditions are selected to be between 500° C. and 700° C. applied for between 1 minute and 30 minutes.

11. The method of claim 1, wherein the second step is carried out by subjecting the first surface to an oxygen containing plasma applied with a power of between about 25 W and 1000 W, at a temperature of between about room temperature and 500° C., and for a time of between about 1 sec and 300 sec.

12. The method of claim 1, wherein the method further comprises cleaning the first surface before the first step, wherein the cleaning comprises at least one application of an oxidation and oxide removal cycle, wherein the oxidation is accomplished with an $H_2O_2$ containing solutions, and the oxide removal is accomplished by a stripping agent, wherein the stripping agent is HF, HCl, or their mixture thereof.

13. The method of claim 1, wherein the first surface is having at least two locations, and wherein the first step is carried out on the at least two locations in a manner to yield differing first concentrations, whereby the produced oxynitride layers on the least two locations have differing EOT.

14. A method for fabricating a high performance Ge-based field effect device, wherein the device comprising a oxynitride layer gate dielectric, and production of the oxynitride layer is comprising:

provided a wafer of Ge-based material, the Ge-based material having a first surface; and carrying out a two step process consisting of a first step followed by a second step, wherein the first step consists of incorporating underneath the first surface a first concentration of nitrogen having a surface density of between about 1E14 per $cm^2$ and 3E15 per $cm^2$, and wherein the second step consists of exposing the first surface to an oxygen containing ambient, thereby oxidizing the Ge-based material and growing the oxynitride layer, wherein the first concentration is so chosen as to govern the oxidizing rate during the second step, wherein the produced oxynitride layer is controlled to be between 0.5 nm and 5 nm of equivalent oxide thickness (EOT).

15. The method for fabricating of claim 14, wherein the high performance Ge-based field effect device is a Ge MOS transistor.

16. A method for producing a germanium oxynitride layer, the method comprising:

providing a wafer, the wafer having a Ge surface; and carrying out a two step process consisting of a first step followed by a second step, wherein the first step consists of incorporating underneath the Ge surface a first concentration of nitrogen having a surface density of between about 1E14 per $cm^2$ and 3E15 per $cm^2$, and wherein the second step consists of exposing the Ge surface to an oxygen containing ambient, thereby oxidizing the Ge and growing the germanium oxynitride layer, wherein the first concentration is so chosen as to govern the oxidizing rate during the second step, wherein the produced germanium oxynitride layer is controlled to be between 0.5 nm and 5 nm of equivalent oxide thickness (EOT).

* * * * *